United States Patent

[11] 3,566,192

[72] Inventor Harvey Stump, Jr.
Thousand Oaks, Calif.

[21] Appl. No. 796,419
[22] Filed Feb. 4, 1969
[45] Patented Feb. 23, 1971
[73] Assignee Semtech Corporation

[54] ELECTRICAL COMPONENT ASSEMBLY
15 Claims, 9 Drawing Figs.

[52] U.S. Cl. .......... 317/101, 174/52, 307/110, 307/1, 339/17, 317/261, 339/254
[51] Int. Cl. .......... H02b 1/04
[50] Field of Search .......... 317/101 (A), 101, 101 (D), 101 (CC), 261; 174/52.6; 307/110, 1; 339/17 (C), 254, 217

[56] References Cited

UNITED STATES PATENTS 2,777,976 1/1957 Brafman .......... 317/261
3,225,258 12/1965 Brekoo et al. .......... 174/52.6(UX)

FOREIGN PATENTS 500,167 2/1939 Great Britain .......... 317/261
955,328 4/1964 Great Britain .......... 317/101(CC)UX

*Primary Examiner*—David Smith, Jr.
*Attorney*—Nilsson, Robbins, Wills & Berliner

ABSTRACT: An electrical assembly wherein components are connected by resilient coils of electrically conductive exposed wire turns. Various components can be coaxially stacked on such coils and interconnected by other components via leads inserted between the wire turns. A housing is provided resiliently supporting components by such coils and the components can be secured by material within the housing having a coefficient of thermal expansion and contraction vastly differing from that of the components. In particular embodiments, capacitors are stacked so that their voltage gradients are in the same direction and are interconnected by diodes so as to constitute a voltage multiplier.

INVENTOR
HARVEY STUMP, JR.
BY Nilsson + Robbins
ATTORNEYS

INVENTOR
HARVEY STUMP, Jr.

BY Nilsson + Robbins
ATTORNEYS

ELECTRICAL COMPONENT ASSEMBLY

BACKGROUND OF THE INVENTION

1. Field of the Invention

The fields of art to which the invention pertains include the fields of electrical connectors, stacked capacitors and housings for component assemblies.

2. Description of the Prior Art

Major advances in the design of basic electrical components have greatly reduced the failure rate of electrical appliances. However, appliances that utilize high voltages, i.e., in the kilovolt range or higher, are still beset by many problems. Thus, connections joining high voltage components must be burr-free and rounded to prevent arc-over and corona-discharge. In many instances high voltage components must be shielded to protect personnel and other components in the assembly. Such shielding usually has been bulky and difficult to install and maintain. This requires expensive and time-consuming manufacturing procedures.

Arcing and corona problems can also be caused by dust or moisture accumulated on the component wiring. Moisture can also drastically affect ceramic capacitors that are often used in high voltage circuits. Techniques used to isolate low voltage devices from dirt and moisture are often unsuccessful with high voltage devices. For example, rigidly encased high voltage assemblies are subject to rupture when the components are expanded by heat developed therewithin. It has also been found that components in high voltage assemblies are usually the first and most frequent to fail (e.g. high voltage section of television receivers) thereby constituting expensive maintenance problems.

SUMMARY OF THE INVENTION

The present invention provides simple yet effective means for overcoming the foregoing problems. Novel construction techniques are provided whereby arc-over and corona-discharge problems are minimized and durable encapsulation is achieved. In accordance with this invention, electrical components are connected by means of normally resilient coils of electrically conductive exposed wire turns. In one embodiment, the coil serves as a connector for component leads whereby normally pointed lead ends are inserted between turns of the coil so that the ends are shielded by the coil against arc-over and corona-discharge problems.

In another embodiment, the coil serves to directly connect the components in resilient association. For example, capacitors can be arrayed in stacks with confronting plates connected by coils coaxially disposed thereon. The capacitors can be readily arrayed so that all potential gradients are in the same direction. Additional components can be connected between the stacks by leads inserted between the coil turns.

A housing is provided with material that resiliently encloses the components and, in combination with the coil connections allows the components to flex, expand and/or contract as required for proper operation. In construction, a portion of the components are held in place in a section of the housing filled with the enclosing material until the material sets. Thereafter, the remainder of the components are assembled with that part of those extending from the set material. Then the remainder of the housing is brought into place and filled with the enclosing material to provide the completed device.

In terms of specific devices, a voltage multiplier is provided wherein a number of capacitors have their plates connected by an appropriate number of coils and means are provided to allow the capacitors to be charged in one current flow direction and serially add in the opposite current flow direction. Thus, solid state diodes can be connected between stacks of capacitors by leads inserted between the coil turns. In the same manner, a feedback capacitor can be connected across one of the stacks to provide voltage regulation.

DESCRIPTION OF THE PREFERRED EMBODIMENTS

Figures 1, 2:
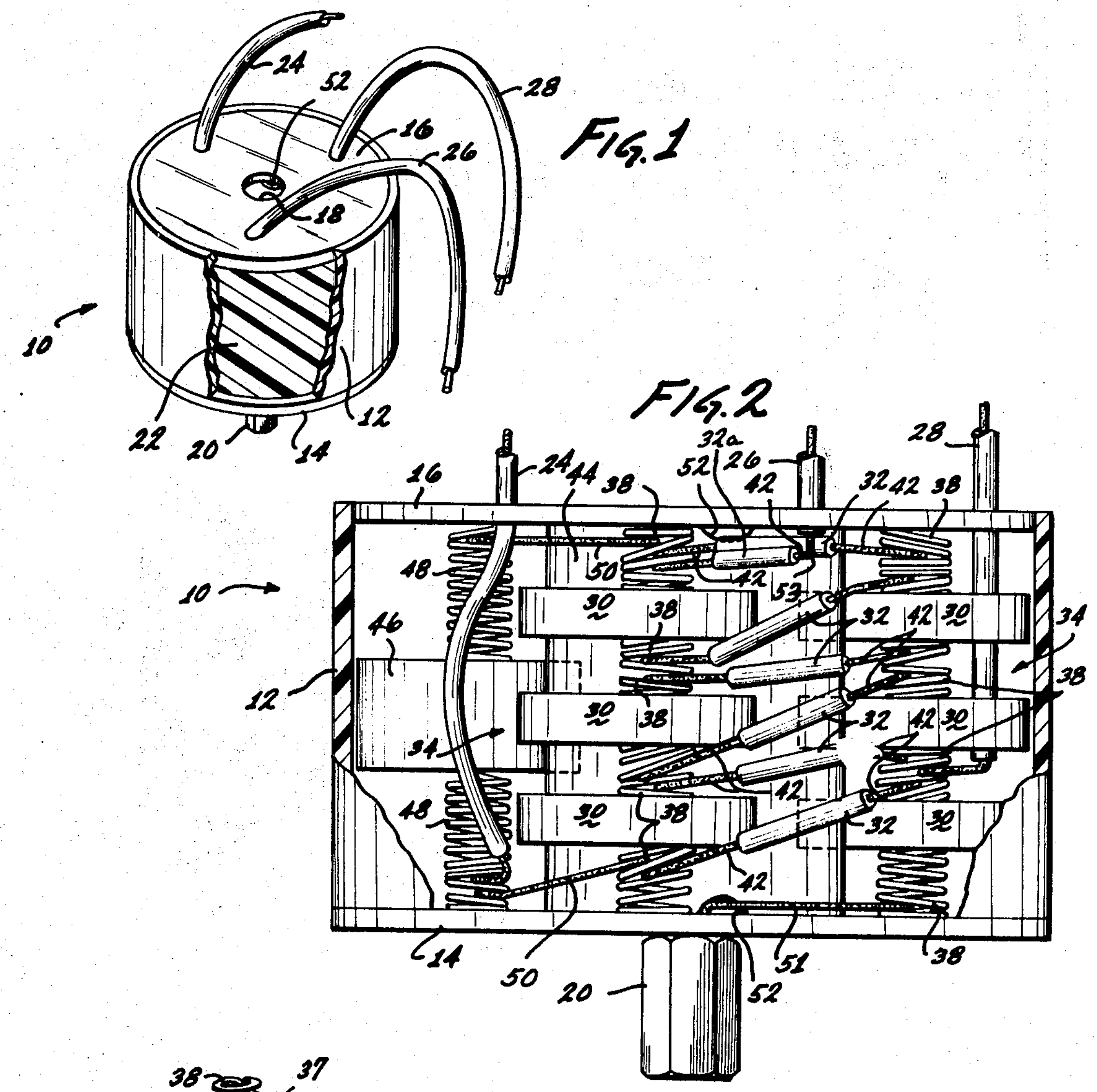
FIG. 1 is a perspective view of a voltage multiplier embodying improvements of this invention with part of the housing cut away to reveal encapsulating material therebeneath.
FIG. 2 is a plan sectional view partly in cross section of one embodiment of the device of FIG. 1 prior to adding the encapsulating material.

Referring to FIG. 1, an enclosure for an electrical component assembly is shown. A housing 10 of high impact plastic is provided comprising a tubular shell 12, bottom plate 14, and top plate 16. The top plate 16 has a centrally located aperture 18 therein to aid in assembly as will be described. A hexagonal nut 20 protrudes from the center of the bottom plate 14 and serves to mount the device and may function as an electrical return or ground for the device.

Within the housing 10 are electrical components (FIG. 2) completely surrounded by encapsulating material which may be in the form of resilient potting material 22 and having insulated electrical leads 24, 26 and 28 therefrom protruding through the top plate 16.

Figure 4:
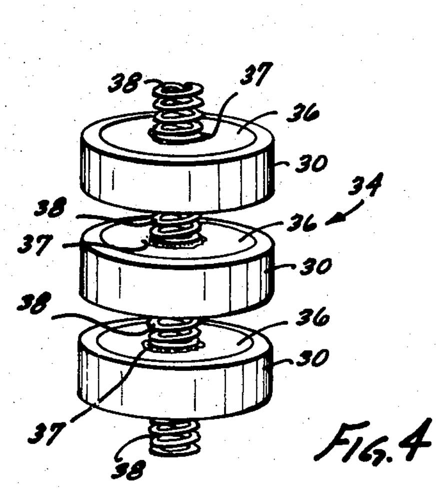
FIG. 4 is a perspective view of a stack of capacitors utilized in the device of FIG. 1.

Referring to FIGS. 2 and 4, the device comprises a plurality of electrical components which, in this case, are capacitors 30 and diodes 32 connected to form a voltage multiplier. The capacitors 30 are arrayed in stacks 34, one of which is shown in perspective in FIG. 4. Each capacitor 30 is of the disc ceramic type with plates 36 formed thereon by deposits of silver as is known in the art. The capacitors 30 are arrayed to have confronting plates 36 connected by coils 38 of wire coaxially disposed thereon. Each coil 38 is made up of electrically conductive exposed wire turns 40 (FIG. 5), for example, of 26 gauge silver wire, and in its normal state is resilient or springy. The coils 38 are conveniently attached to the capacitor plates 36 by conductive epoxy compound 37, should such be desired.

Still referring to FIG. 2, in assembly two stacks 34 of capacitors 30, constructed as in FIG. 4, are arranged side by side, each stack being held by coils 38 between the bottom and top plates 14 and 16 of the housing 10 and surrounding a tubular core 44, of high impact plastic, which serves as a spacer for the housing plates 14 and 16. Solid state diodes 32 are arranged, in an order as will be described, to interconnect the capacitors 30. Leads 42 are provided on the diodes 32 for connection to the capacitor stacks 34. An additional, wider capacitor 46 is held between the housing plates 14 and 16 by coils 48 and is connected, at bottom and top, to one of the stacks 34 by wire leads 50. Another wire lead 51 connects the other stacks 34 to the ground 20 and is soldered thereto (connection not shown). The insulated leads 24, 26 and 28 are connected to the component assembly to provide appropriate leads thereto. One insulated lead 24 is connected to the large capacitor 46 via one of its coils 48, another insulated lead 26 is soldered at 53, to a diode lead 42, and the third insulated lead 28 is connected to one of the stacks 34.

Figure 5:
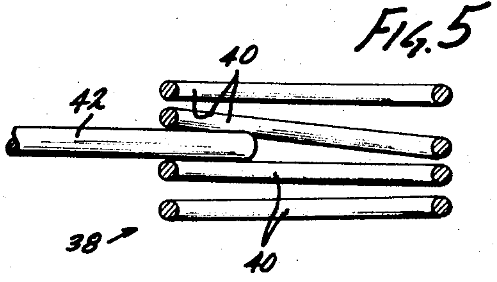
FIG. 5 is a closeup plan sectional view of a coil and lead connection of this invention.

Referring to FIG. 5, several advantages of this invention are illustrated. The diode leads 42 (as well as the wire leads 50 and 51 and two insulated leads 24 and 28) are connected to their respective coils 38 or 48 by being inserted between turns 40 of such coils. The leads are shielded by the coils 38 and 48 and the exterior circuit surfaces "see" only the relatively large coil diameter. The result is that arc-over and corona-discharge problems are greatly reduced.

Another very important advantage is that such connections need not be soldered. The normal resiliency or springiness of the coil 38 or 48 sufficiently grips the lead to maintain the connection until permanently secured by the encapsulating material. It will be appreciated that such a feature allows significant savings in manufacturing costs and greatly facilitates the construction of component assemblies.

Referring again to FIG. 2, the top plate 16 is sufficiently smaller in diameter than the bottom plate 14 to allow the tubular outer housing shell 12 to slide thereover and fit on the rim of the bottom plate 14 to complete assembly of the housing 10. The aperture 18 in the top plate 16 overlies the tubular core 44. The core 44 is hollow and is provided with notches 52 at its top and bottom (see, also FIG. 1) for open communication between the top plate aperture 18 and components within the housing 10.

To encapsulate the electrical components and secure together the housing 10, the encapsulating material 22 is poured into the top plate aperture 18 until the housing is completely filled. The encapsulating material is then cured to form a cushion that surrounds and yieldably supports the component assembly. The housing and resilient encapsulating material protect the electrical components from dust and moisture, yet allow them to flex, expand, or contract when used.

An encapsulating material may be used that is resilient when cured so as to allow greater expansion of the components. Thus, "Polycin," a urethane elastomer resin, obtainable from Baker Castor Oil Company, Bayonne, N.J., can be used. "Thiokol" resilient epoxy casting resin, obtainable from Thiokol Chemical Corporation, Trenton, N.J., may be used. Silicone casting resins can also be used as can "Silastic" a room temperature vulcanizing silicone rubber from Dow Chemical Corporation, Midland, Mich. It should also be understood that other resins known to the art can also be used whether resilient or not, depending upon the expansion of the components.

As previously noted, arc-over problems are greatly reduced by the coil-lead connection used herein. Further reduction is possible by arranging the stacks 34 so that voltage gradients across the capacitors 30 are in the same direction. For example, each stack 34 can have its low potential level at the bottom housing plate 14 and its high potential level at the top housing plate 16. The result is that there are no voltage gradients of significant amounts from one stack 34 to another.

Figure 3A:
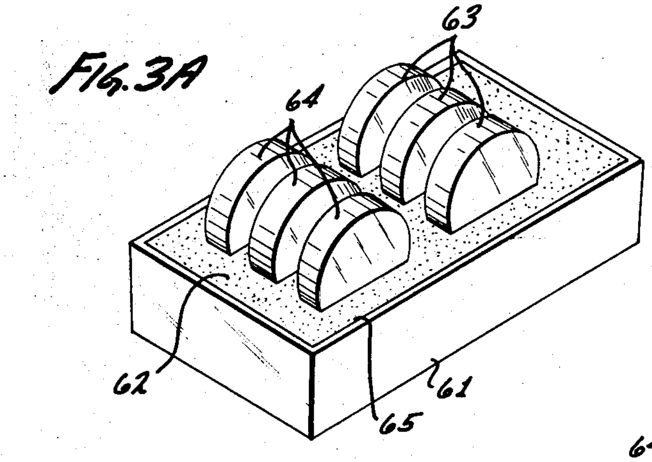
FIGS. 3A, 3B, 3C and 3D, are schematic representations of a second embodiment of a device in accordance with the present invention during various stages of production thereof.

Referring now to FIGS. **3*a* through 3*d*, an alternative embodiment and method of constructing the same for an encapsulated high voltage device constructed in accordance with the present invention is illustrated. As is shown herein, a first section 61 of a housing is provided and is filled with the encapsulating material 62 in such a manner that insertion of electrical components 63—64 partially thereinto would bring the encapsulating material to the top edge surface 65 of the section 61 of the housing. After its insertion of the components 63-—64, into the encapsulating material 62, the material is allowed to set thereby to hold the electrical components 63—64 in place as illustrated in FIG. 3*a*. The holding of the components 63—64 may be accomplished by any means desired such as a jig or fixture which securely maintains the components 63—64 in preferred spatial relation and which might fit so as to ride upon the side edge 65 of the top portion of the section 61 of the housing until such a time as the encapsulating material 62 has set; thereafter a jig or fixture (not shown) could be removed thus leaving the components 63—64** in the position illustrated.

After the encapsulating material 62 has set the electrically conducting resilient wire coils or springs 66 are inserted in place between adjacent ones of the electrical components 63-—64 and the side edges of the housing section 61 as specifically illustrated in FIG. **3*b*. If desired, as above pointed out, conductive epoxy cement may be utilized to hold the springs 66 in place, although in some forms of devices constructed in accordance with the present invention friction alone is all that is required to accomplish the desired electrical conductivity between adjacent components. After insertion of the springs as above pointed out electrical components such as the solid state diodes 67** may be inserted in place to complete the desired circuit.

Figure 3B:
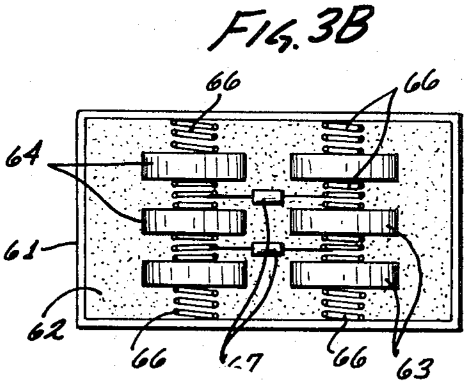
Figures 3C, 3D, 6:
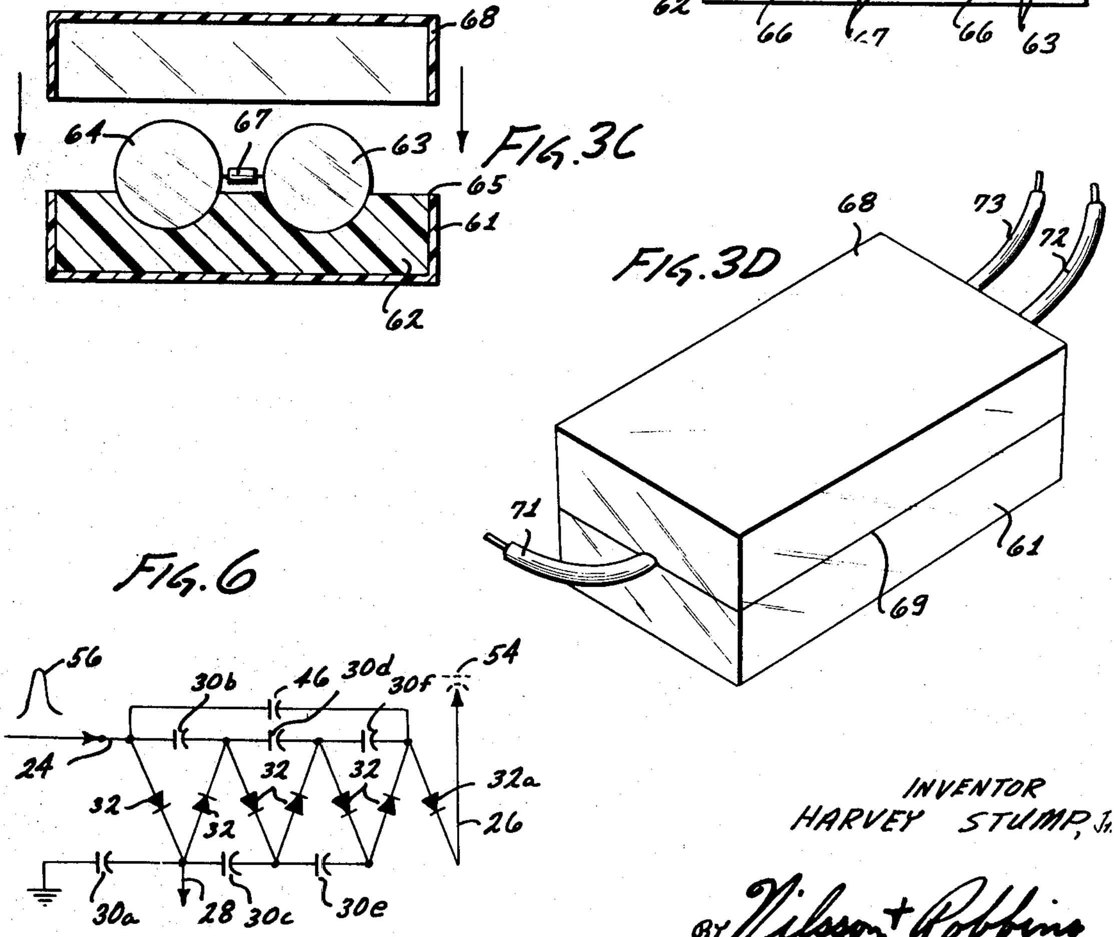
FIG. 6 is a circuit diagram of the voltage multiplier of FIG. 1.

After construction as above illustrated so that the encapsulating material 62 (FIG. **3*c*) holds the electrical component 63—64 in place with the springs properly inserted as illustrated in FIG. 3*b* and the diodes 67 in proper connection as above described a second section 68 of the housing (FIG. 3*c*) is brought into place and lowered so as to match the side edges 65 of the lower section 61; thereafter the cavity remaining within the upper section 68 is filled with the encapsulating material which is allowed to set and to adhere to the encapsulating material 62 in the lower section 61 of the housing. Leads were properly inserted prior to the lowering of the housing section 68 and filling thereof with encapsulating material thereby providing electrical connections to the various portions of the components supported within the completed device as shown in FIG. 3*d***.

As is shown in FIG. **3*d*, the lower section of the housing 61 and the upper section 68 are brought together at a mating line 69 and electrical leads 71, 72 and 73** are extending therefrom for connection into any desired circuit depending upon the particular application to which the invention is to be put. For example, a device may be connected as the high voltage rectifier portion of a television receiver.

The assembled components constitute a voltage multiplier and such devices are particularly improved by the assembly techniques of this invention because of the high voltages encountered at various points of the circuit. FIG. 6 illustrates a circuit of the voltage multiplier. In this case the multiplier is being used as the high voltage source for the second anode 54 of a cathode ray tube wherein flyback voltages 56 are utilized as the voltage source. The flyback voltage 56, essentially a unidirectional peak of, say, 6000 volts, is applied to the input lead 24. This amount of voltage appears across the first stage capacitor **30*a* which adds about 3000 volts (since the capacitor 30*a* will seek essentially a DC level) to the next stage capacitor 30*b* to bring the voltage across that capacitor to about 9000 volts. Thereafter, 3000 volts are serially added by each capacitor 30 so that 12,000, 15,000, 18,000 and 21,000 volts appear across the next successive capacitors 30*c*, 30*d*, 30*e* and 30*f* respectively, and about 21,000 volts appear across the feedback capacitor 46**, in parallel with the voltage multiplier. The capacitors *a/e* charged in parallel from the input 24 and added in series for the output, the switching being accomplished by the diodes 32.

At the output, the peak of 6000 volts is applied through a coupling diode to the output lead 26 which, in turn, is connected to the second anode 54 so that, with the serially added voltages, a total of 24,000 volts appear across the second anode 54. The device can supply other voltages; for example, voltage for focus control of the cathode ray tube can be tapped from the device after the first capacitor **30*a* by means of the lead 28** attached thereto.

Although the foregoing electrical components have been described as capacitors and diodes constituting voltage multiplier, the principles are clearly applicable to a wide variety of other electrical components and component assemblies.

I claim:

1. An electrical assembly comprising:
at least two electrical components;
at least one normally resilient coil of electrically conductive exposed wire turns between said components to connect said components in resilient association; and
at least one additional component formed with an electrical lead, the end of said lead being inserted between said wire turns to terminate within said coil whereby to be electrically shielded by said coil.

2. The assembly of claim 1 wherein said components comprise a stack of capacitors each having flat, opposed plates, said capacitors being electrically and resiliently connected by an appropriate number of said coils coaxially disposed on said plates.

3. The assembly of claim 1 wherein said components comprise;
at least two stacks of capacitors, the capacitor in each stack being electrically connected by an appropriate number of said coils resiliently between said capacitors; and
additional components connected between said stacks by leads inserted between said wire turns to terminate within respective coils.

4. The assembly of claim 3 wherein said additional components comprise solid state diodes connecting said capacitors so as to multiply voltage applied thereto.

5. The assembly of claim 4 including a feedback capacitor connected across one of said stacks by leads inserted between said turns to terminate within respective coils.

6. The assembly of claim 1 wherein said components comprise:
at least two stacks of capacitors, each capacitor having flat, opposed plates, said capacitors being electrically connected by an appropriate number of said coils coaxially disposed on said plates resiliently between said capacitors to form said stacks; and
electrical leads to said stacks inserted between said turns to terminate within respective coils, said leads being arranged so that voltage gradients across said capacitors are in the same direction.

7. An electrical assembly, comprising:
a normally resilient coil of electrically conductive exposed wire turns; and
an electrical component formed with a lead, the end of said lead inserted between turns of said coil and terminating within said coil whereby to be electrically shielded by said coil.

8. The assembly of claim 7, including a housing for said coil and component and a resilient potting material resiliently enclosing said coil and component in said housing.

9. The assembly of claim 1 including a housing, at least one of said components being resiliently supported within said housing by said coil.

10. The assembly of claim 9 including resilient potting material resiliently enclosing said components in said housing.

11. A method of assembly for an electrical device, which comprises:
connecting an electrical component to a normally resilient coil of electrically conductive exposed wire turns; and
inserting an electrical lead from a second component between turns of said coil to terminate within said coil whereby to be electrically shielded by said coil and to form an electrical contact therewith.

12. A method of packaging an electrical device, which comprises:
supporting an electrical component between resilient coils of electrically conductive exposed wire turns on a portion of a housing therefor;
inserting an electrical lead from a second component between the turns of one of said coils to be secured thereby;
assembling a complete housing around said component with an opening in said housing to said component; and
pouring material which sets to a resilient solid into said opening to encapsulate said component.

13. The method of claim 12 wherein said housing is assembled so that said component is resiliently supported between opposed housing portions.

14. The method of claim 12 wherein said potting material forms a resilient body around said component.

15. The method of claim 12 including the steps of interconnecting a number of additional electrical components with leads inserted between coils of electrically conducting exposed wire turns and resiliently supporting said coils between opposed housing portions.